United States Patent
Soerensen et al.

(10) Patent No.: US 6,373,883 B1
(45) Date of Patent: Apr. 16, 2002

(54) RADIO RECEIVER AND A RADIO TRANSMITTER

(75) Inventors: Henrik Soerensen, Norresundby; Michael Brammer, Abybro Biersted, both of (DK)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/235,662

(22) Filed: Jan. 22, 1999

(30) Foreign Application Priority Data

Jan. 23, 1998 (EP) .......................................... 98 101 136

(51) Int. Cl.$^7$ .............................................. H04L 27/32
(52) U.S. Cl. ........................ 375/216; 375/273; 375/302; 375/324; 455/553; 455/260; 455/318; 455/323; 329/316; 332/119
(58) Field of Search ................................. 375/216, 219, 375/268, 271, 273, 300, 302, 324, 327; 455/552, 553, 260, 313, 318, 323; 329/316, 317, 348; 332/120, 151, 119

(56) References Cited

U.S. PATENT DOCUMENTS

| | | | |
|---|---|---|---|
| 5,442,655 A | | 8/1995 | Dedic et al. ................. 375/340 |
| 5,852,784 A | * | 12/1998 | Ito et al. ..................... 455/552 |
| 5,983,088 A | * | 11/1999 | Aschwanden ............ 455/188.2 |
| 6,208,875 B1 | * | 3/2001 | Damgaard ................... 455/552 |

FOREIGN PATENT DOCUMENTS

| | | | |
|---|---|---|---|
| EP | 0 651 522 A1 | 5/1995 | ............ H04B/1/26 |
| EP | 0 653 851 A2 | 5/1995 | ............ H04B/1/40 |
| EP | 0 792 027 A1 | 8/1997 | ............ H04B/1/40 |

OTHER PUBLICATIONS

"Toward a Combined GSM 900 DCS 1800 System" by Duplessis et al., Matra Communication, No. Seminar 5, Dec. 1, 1992, pp. 89–92, France.

"Toward a Combined GSM 900 DCS 1800 System" by P. Simmons Duplessis, Matra Communications, pp. 89–92, France, Dec. 1992.

* cited by examiner

Primary Examiner—Amanda T. Le
(74) Attorney, Agent, or Firm—Fich & Richardson P.C.

(57) ABSTRACT

A radio receiver is adapted to receive radio signals in at least two frequency bands, in which the radio signals are modulated by information signals. The radio receiver includes a device for down-converting a received radio signal to an intermediate frequency signal by using a local oscillator, and a demodulating device for recovering the information signals from the intermediate frequency signal. The frequency of the local oscillator is selected so that the frequencies of at least one of the frequency bands are above the frequency of the local oscillator, and the frequencies of at least one of the frequency bands are below the frequency of the local oscillator.

12 Claims, 5 Drawing Sheets

RADIO RECEIVER AND A RADIO TRANSMITTER

FIELD OF THE INVENTION

The present invention is directed to a radio receiver including a device for down-converting a received radio signal modulated by information signals to an intermediate frequency signal by using a local oscillator, and a demodulating device for recovering the information signals from the intermediate frequency signal. The radio receiver of the present invention is adapted to receive radio signals in at least two frequency bands.

The present invention also is directed to a corresponding radio transmitter adapted to transmit radio signals in at least two frequency bands, the radio transmitter including a device for modulating an intermediate frequency signal by information signals, a device for converting the intermediate frequency signal to a radio signal by using a local oscillator, and a device for transmitting the radio signal.

BACKGROUND INFORMATION

In known receivers and transmitters, of which the super-heterodyne receiver and corresponding transmitters are examples, the frequency of the local oscillator can be selected either above or below the frequencies of the relevant frequency bands. For each band the frequency of the oscillator should be variable over a range corresponding to the range of the band, because the difference in frequency between the radio signals and the local oscillator should be equal to the frequency of the intermediate signal, which has a very low bandwidth around a fixed frequency. However, in many situations the frequency bands cover a wide frequency range. This is the case, for example, with respect to multi-band mobile telephones. Such telephones could for instance be adapted to receive and/or transmit signals in the GSM900 band (900 MHZ) and the GSM1800 band (1800 MHZ). If the same local oscillator should be used for the two bands in this case, the oscillator should be variable over a range of at least 900 MHZ, which would be very difficult to implement in practice. Therefore, it will normally be necessary to use a separate local oscillator for each band.

However, the use of two or more separate local oscillators complicates the design of the receiver or the transmitter considerably, and, especially, it takes up more space, which is a critical point in mobile telephones, because much effort is devoted to reducing the size of the telephones.

SUMMARY OF THE INVENTION

An object of the present invention is, therefore, to provide a receiver and a transmitter which are able to receive/transmit signals in at least two frequency bands with the use of only one single local oscillator.

In accordance with the present invention, this object is achieved in that the frequency of the local oscillator is selected so that the frequencies of at least one of the frequency bands are above the frequency of the local oscillator, and the frequencies of at least one of the frequency bands are below the frequency of the local oscillator.

When the frequency of the local oscillator is selected to be between the relevant frequency bands, i.e. above the frequencies of the lower band (e.g., 900 MHZ) and below the frequencies of the upper band (e.g., 1800 MHZ), the range over which a single oscillator should be variable (i.e. the bandwidth of the oscillator) is reduced considerably. Therefore, it is possible to implement such an oscillator in practice.

When the receiver or the transmitter of the present invention is adapted to receive or transmit radio signals in only two frequency bands and the frequency of the local oscillator is selected in a range substantially halfway between the two frequency bands, the range over which the single oscillator should be variable is reduced even further to a range of substantially the same size as for each band, because approximately the same oscillator frequencies may be used for both bands. If, for instance, the two bands are the earlier-mentioned GSM900 and GSM1800 bands, the intermediate frequency could be selected to be approximately 450 MHZ, causing the frequency of the local oscillator to be in a range of around 1350 MHZ for both bands.

With respect to the receiver, it is well known that the selection of a local oscillator frequency above the frequencies of the relevant frequency band for the received radio signals causes sideband reversal in the down-converted signal, so that the upper side band at radio frequency becomes the lower side band at the intermediate frequency, and vice versa. This side band reversal does not occur when the frequency of the local oscillator is below the frequencies of the radio frequency signals. When the local oscillator frequency is selected between the two bands, a switch from reception in one band to reception in the other band will therefore also cause a change of the side bands in the intermediate frequency signal. This change of sidebands must be compensated in the receiver, for instance in the demodulating device.

When the demodulating device is a quadrature demodulator adapted to recover the information signals in the form of an In-phase signal (I signal) and a Quadrature-phase signal (Q signal), and when the modulation of the received radio signals is a phase modulation or a frequency modulation, this compensation may be implemented by implementing a receiver that includes a device for assigning one sign (+or −) to the Q signal when the frequency of the received radio signal is below the frequency of the local oscillator, and the opposite sign when the frequency of the received radio signal is above the frequency of the local oscillator. It can be shown that in the quadrature demodulator the change of side bands means a change of the sign of the Q signal and, therefore, the change may be compensated by changing the sign back.

Further, it can be shown that a change of sign of the Q signal is equivalent to swapping or exchanging the I signal and the Q signal. Therefore, the compensation of the change of sidebands may be implemented in that the receiver moreover comprises a device for keeping the I signal and the Q signal unchanged when the frequency of the received radio signal is above the frequency of the local oscillator, and for exchanging the I signal and the Q signal when the frequency of the received radio signal is below the frequency of the local oscillator.

In the transmitter case a similar effect is present. The selection of a local oscillator frequency above the frequencies of the relevant frequency band for the transmitted radio signals causes sideband reversal, so that the upper side band at intermediate frequency becomes the lower side band at the radio frequency, and vice versa. Also here, the side band reversal does not occur when the frequency of the local oscillator is below the frequencies of the radio frequency signals. When the local oscillator frequency is selected between the two bands, a switch from transmission in one band to transmission in the other band will therefore also cause a change of the side bands in the radio frequency signal. This change of sidebands must be compensated in the transmitter.

When the modulating device is a quadrature modulator adapted to modulate the intermediate frequency signal by information signals in the form of an I signal and a Q signal, and when the modulation of the received radio signals is a phase modulation or a frequency modulation, this compensation may be implemented by a transmitter that includes a device for assigning one sign (+or −) to the Q signal when the frequency of the radio signal is below the frequency of the local oscillator, and the opposite sign when the frequency of the radio signal is above the frequency of the local oscillator. As with the receiver, it can be shown that in the quadrature modulator a change of the sign of the Q signal corresponds to a change of side bands in the intermediate frequency signal and, therefore, such a change can compensate the sideband change that occurs when the intermediate frequency signal is converted to the radio signal.

It can be shown that a change of sign of the Q signal is equivalent to swapping or exchanging the I signal and the Q signal. Therefore, the compensation of the change of sidebands may be implemented in that the transmitter moreover comprises a device for keeping the I signal and the Q signal unchanged when the frequency of the radio signal is above the frequency of the local oscillator, and for exchanging the I signal and the Q signal when the frequency of the radio signal is below the frequency of the local oscillator.

DETAILED DESCRIPTION

Figure 1:
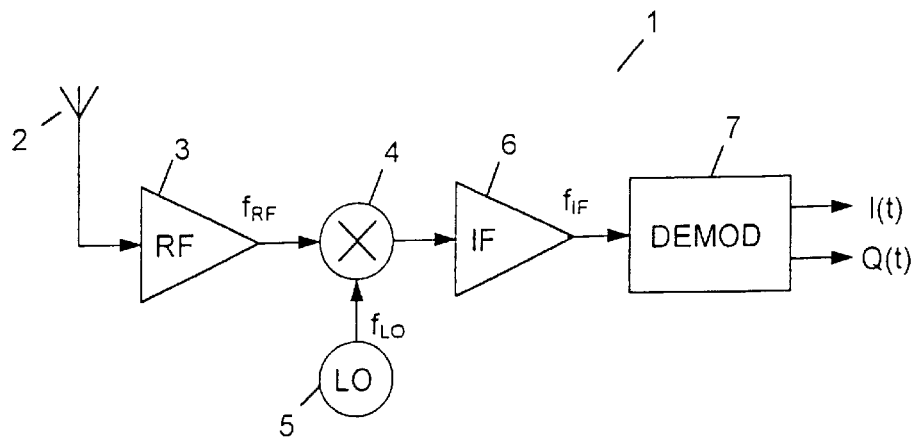
FIG. 1 shows a receiver for radio signals according to the present invention.

FIG. 1 shows a receiver 1 for radio signals. The incoming radio signals are received at an antenna 2 and taken to a radio frequency tuner and amplifier 3. The amplified radio frequency signals are then down-converted to a predetermined intermediate frequency $f_{IF}$ in a frequency converter comprised of a mixer 4 and a local oscillator 5. The adjustable frequency $f_{LO}$ of the local oscillator 5 may be selected below or above the radio frequency $f_{RF}$ that is to be received, as is shown in FIG. 2, so that $$f_{LO}=f_{RF}+f_{IF}$$

or $$f_{LO}=f_{RF}-f_{IF}.$$

In both cases, an intermediate frequency $f_{IF}=|f_{RF}-f_{LO}|$ will be produced in the mixer 4.

Figure 2:
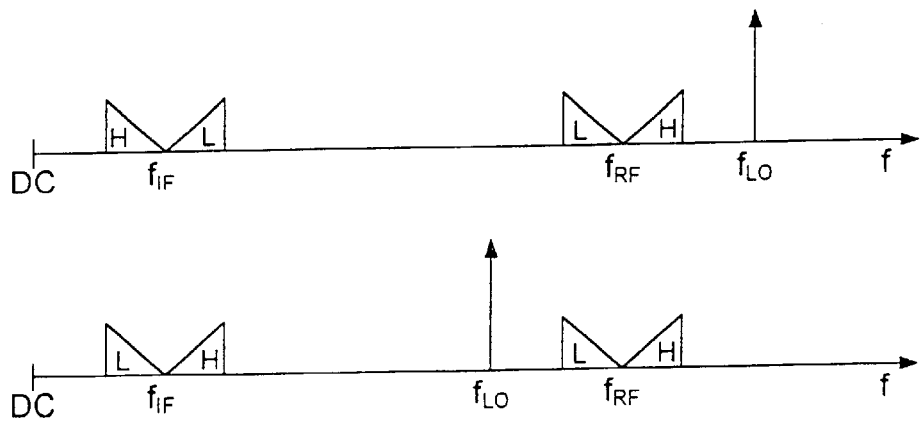
FIG. 2 shows the spectrum of signals with a local oscillator above and below the radio frequency band, respectively.

FIG. 2 shows the spectrum of the various signals vs. frequency. $f_{LO}$ is shown as an arrow at a single frequency, whereas the RF and IF signals are shown as spectrums with a certain spectral distribution. (The specific distribution shown is not important, it may vary depending on the modulation scheme used). An L (for low) and H (for high) are used to indicate the position of each part of the RF spectral distribution.

In both cases, the RF spectrum is down-converted to the IF spectrum using the LO signal. In the lower part of the figure where $f_{LO}$ is below $f_{RF}$, the spectrum of the RF signal remains unaltered, except for the shift to a lower frequency ($f_{IF}$). On the other hand, in the upper part of the figure where $f_{LO}$ is above $f_{RF}$, the spectrum of the RF signal is switched, so that the H portion is moved to the low side, and the L portion is moved to the high side. In other words, the spectrum of the RF signal is replaced by the mirror of the same spectrum at IF (spectrum mirroring or sideband reversal).

As will be seen from FIG. 1, the intermediate frequency signal is fed from an IF amplifier and filter 6 to a demodulator 7. Very often this will be a quadrature demodulator, and in that case the outputs from the demodulator 7 will be in the form of the two quadrature signals labeled I(t) and Q(t). These signals are then processed in decoding circuitry in the apparatus. However, as this part of the apparatus is not relevant for the present invention, it is not shown in the figure. The function of the quadrature demodulator will be described later.

Figure 3:
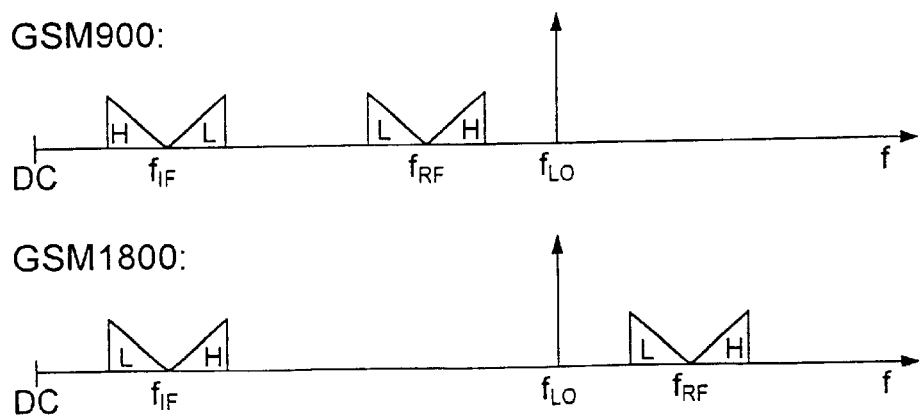
FIG. 3 shows respective graphs for GSM900 and GSM1800 signals.

A receiver according to the present invention is adapted to receive radio signals in at least two different frequency bands. For instance multiband mobile telephones could be adapted to receive and/or transmit signals in the GSM900 band (900 MH$_Z$) and the GSM1800 band (1800 MH$_Z$). If the frequency of the local oscillator is selected above $f_{RF}$ for the lower band and below $f_{RF}$ for the higher band, as is shown in FIG. 3, the frequencies of the local oscillator could be selected from the same range for both bands. However, as mentioned above, this will have the drawback that the sideband reversal will take place for the lower band. This means that when the receiver switches from one band to the other, a switch of sidebands will take place in the intermediate frequency signal, and such a switch is normally not allowable.

Figure 4:
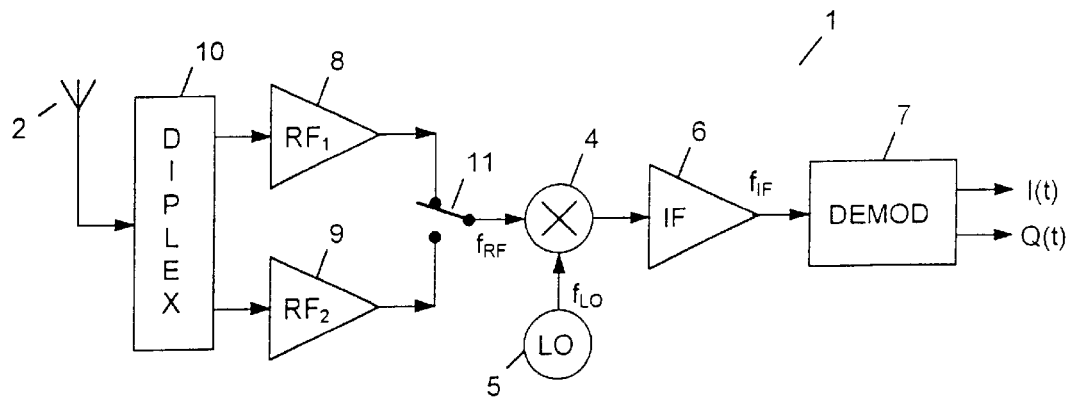
FIG. 4 shows an alternative embodiment for a receiver according to the present invention.

Normally, it will be difficult for the radio frequency amplifier 3 to handle signals with such a great difference in frequency and, therefore, the circuit may be modified as shown in FIG. 4. In this case, an amplifier is provided for each band, i.e. an amplifier 8 for one band (e.g. GSM900) and an amplifier 9 for the other band (GSM1800). The input from the antenna 2 is passed through a diplexer 10, which is a combination of bandpass filters separating the two bands. A switch 11 selects which of the two amplified radio frequency signals is sent to the mixer 4. In other respects the circuit is similar to that of FIG. 1.

The function of the quadrature modulator and demodulator will be described in the following. The demodulator is used in the receiver and the modulator correspondingly in a transmitter. The function of the modulator is to move information from baseband up to a carrier which is the intermediate frequency ($f_{IF}$) in this case. The quadrature modulator is a special modulator, characterized by its ability to be used at both amplitude modulation (AM), phase modulation (PM) and frequency modulation (FM) and also at the digital equivalents PSK and FSK. Furthermore, the quadrature modulator is able to suppress the carrier itself and unwanted mixing products (spurious signals), a functionality which is often hard to achieve using other types of modulators.

Figure 5:
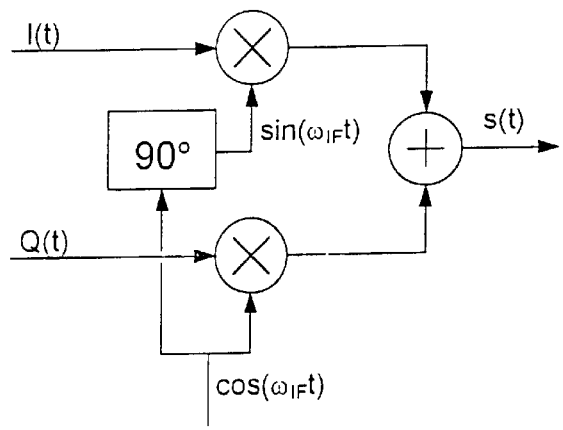
FIG. 5 shows the function of a quadrature modulator.

The schematic of the quadrature modulator is shown in FIG. 5. Input signals to the modulator are the two signals I (t) and Q (t). According to FIG. 5, the output s(t) of the quadrature modulator is given as (the angular frequency is defined as $\omega=2\pi f$):

$$s(t)=I(t)\sin(\omega_c t)+Q(t)\cos(\omega_c t), \quad (A.1)$$

This expression may be rewritten as:

$$s(t)=A(t)\sin(\omega_c t+\psi(t)) \quad (A.2)$$

where $$A(t)=\sqrt{I^2(t)+Q^2(t)}$$

and $$\varphi(t) = \arctan\left(\frac{Q(t)}{I(t)}\right)$$

(A.2) is the general expression for a modulated signal. In (A.2), A(t) is the amplitude of the modulated signal s(t), and $\psi(t)$ is the phase of s(t). The carrier frequency is $\omega_c=2\pi f_c$.

Furthermore, it also follows from (A.2) that:

$$I(t)=A(t)\cos(\psi(t)) \quad (A.3)$$

and $$Q(t)=A(t)\sin(\psi(t)). \quad (A.4)$$

Figure 6:
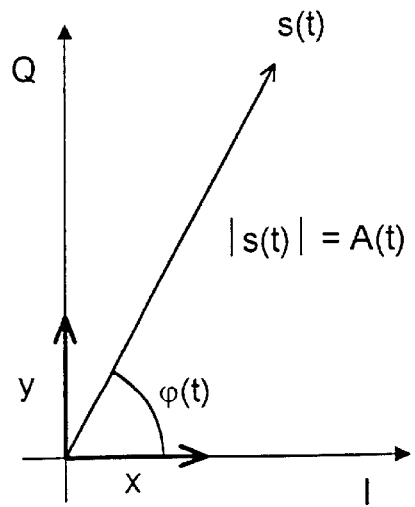
FIG. 6 shows a signal vector for the modulator of FIG. 5.

From (A.3) and (A.4), s(t) may be expressed as a vector $$s(t)=I(t)x+Q(t)y \quad (A.5)$$

since the orthogonal functions $\cos(\omega_c t)$ and $\sin(\omega_c t)$ may be considered as the orthogonal unity vectors x and y, respectively. The signal vectors s(t) with length A(t) and angle $\psi(t)$ is shown in FIG. 6.

The function of the quadrature demodulator is to move information from the IF frequency in this case down to baseband. This is described through the diagram in FIG. 7.

Figure 7:
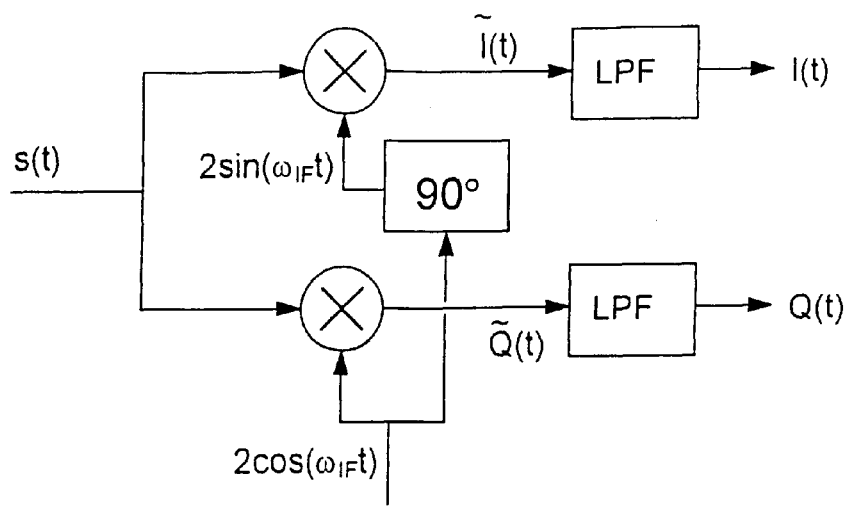
FIG. 7 shows the function of a quadrature demodulator.

By considering one of the branches in FIG. 7, the signal $\tilde{I}(t)$ may be calculated as $$\begin{aligned}\tilde{I} &= 2\sin(\omega_c t)s(t) \quad (A.6)\\ &= 2\sin(\omega_c t)(I(t)\sin(\omega_c t)+Q(t)\cos(\omega_c t))\\ &= I(t)(1-\cos(2\omega_c t))+Q(t)\sin(2\omega_c t)\\ &= I(t)-I(t)\cos(2\omega_c t)+Q(t)\sin(2\omega_c t).\end{aligned}$$

The high frequency terms are removed by using the lowpass filter, and the result is the baseband signal I(t). Q(t) may be obtained similarly.

Remembering now the general expression for a modulated signal, the radio frequency signal received at the antenna 2 may be written as $$s(t)=A(t)\sin(\omega_{RF}t+\psi(t)).$$

As seen above, the intermediate frequency is obtained by down-conversion using the local oscillator (LO) frequency:

GSM900: $f_{IF1}=f_{LO}-f_{RF1}$ (A.7)

GSM1800: $f_{IF2}=f_{RF2}-f_{LO}$ (A.8)

From (A.7) and (A.8), the input s (t) to the demodulator, i.e. the intermediate frequency signal, is given by:

GSM900:

$$\begin{aligned}S_{IF1}(t) &= A(t)\sin(\omega_{LO}t-(\omega_{RF1}t+\varphi(t))) \quad (A.9)\\ &= A(t)\sin(\omega_{LO}t)-\omega_{RF1}t-\varphi(t))\\ &= A(t)\sin(\omega_{IF1}t-\varphi(t))\end{aligned}$$

where $$\omega_{IF1}=\omega_{LO}-\omega_{RF1},$$

and

GSM1800:

$$\begin{aligned}S_{IF2}(t) &= A(t)\sin(\omega_{RF2}t+\varphi(t)-\omega_{LO}t) \quad (A.10)\\ &= A(t)\sin(\omega_{IF2}t+\varphi(t))\end{aligned}$$

where $$\omega_{IF2}=\omega_{RF2}-\omega_{LO}.$$

From (A.9) and (A.10), it is observed that the phase $\psi(t)$ changes sign when a switch is made between GSM900 and GSM1800.

For GMSK and other phase modulation schemes, the amplitude A(t) is constant, and the I- and Q-signals are, therefore, given by (cf. (A.3) and (A.4)):

$$I(t)=A\cos(\psi(t)) \quad (A.11)$$

and $$Q(t)=A\sin(\psi(t)) \quad (A.12)$$

Consequently, the following set of relations between the I and Q signals is obtained from (A.9) and (A.10):

$$I_{1800}(t)=A(t)\cos(\psi(t))=I_{900}(t)=A(t)\cos(-\psi_{900}(t)) \quad (A.13)$$

$$Q_{1800}(t)=A(t)\sin(\psi(t))=-Q_{900}(t)=A(t)\sin(-\psi_{900}(t)) \quad (A.14)$$

where $$\psi_{900}(t)=-\psi(t).$$

Figure 8:
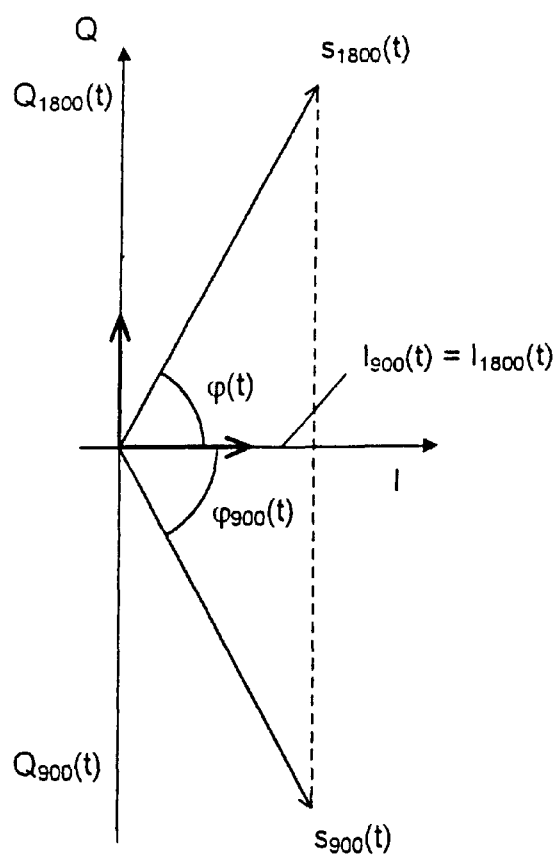
FIG. 8 shows a vector diagram of a change of sign of the Q signal.

The vector signal diagram shown in FIG. 8 may be constructed from equations (A.13) and (A.14).

Figure 9:
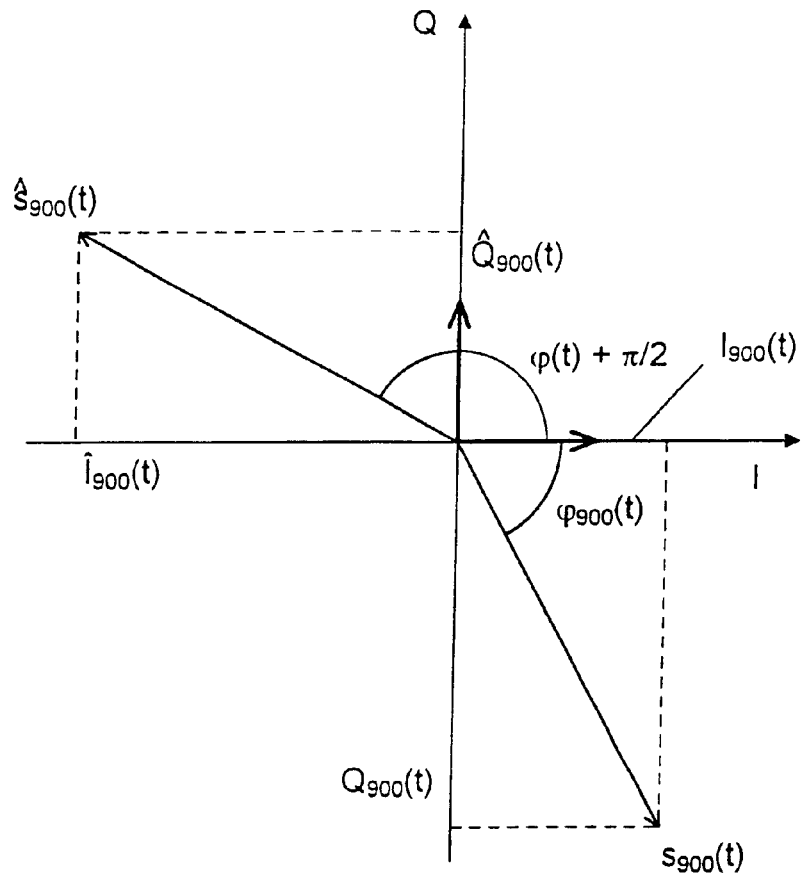
FIG. 9 shows a vector diagram of the swapping of the I and Q signals.

As the phase $\psi(t)$ changes as a function of time, the two vectors will rotate reversely. In order for the I and Q signals to be identical, it is necessary to change the sign of Q(t) when the band is switched between GSM900 and GSM1800. The same result is obtained by swapping the I and Q signals. In the latter case, the phase will rotate in the same direction for both GSM900 and GSM1800, but there will be a constant difference of 90° between the two bands, as illustrated in FIG. 9.

This can be seen from:

$$\hat{I}_{900}(t)=Q_{900}(t)=-A(t)\sin(\psi(t))=A(t)\cos(\psi(t)+\pi/2) \quad (A.15)$$

$$\hat{Q}_{900}(t)=I_{900}(t)=A(t)\cos(\psi(t))=A(t)\sin(\psi(t)+\pi/2) \quad (A.16)$$

where $\hat{I}_{900}(t)$ and $\hat{Q}_{900}(t)$ denote the I- and Q-signals after the swapping.

A constant phase contribution is, however, not a problem, since the absolute phase is always unknown. Therefore, it is of no importance whether the sign of Q(t) is switched, or I(t) and Q(t) is swapped. Consequently, the sideband reversal in the down-converted signal may be compensated by swapping the I and Q signals at the output of the quadrature demodulator.

Figure 10:
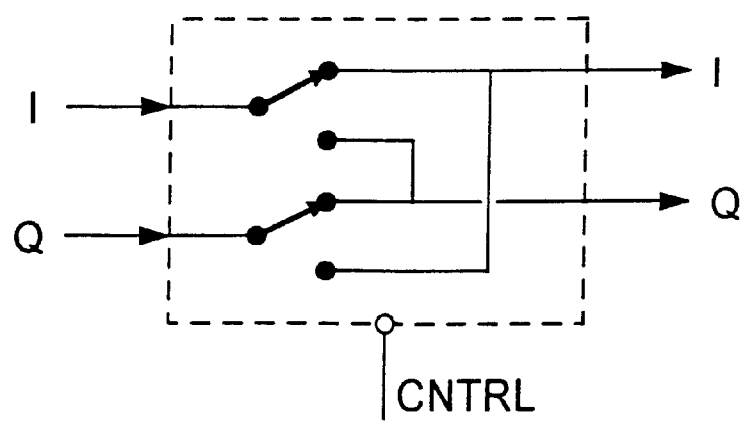
FIG. 10 shows an implementation of the swapping of the I and Q signals.

The swapping of the I and Q signals may be implemented with an analog switch circuitry, as shown in FIG. 10, where the CNTRL input places the switch in the lower position for GSM900 (swap) and in the upper position for GSM1800 (no swap).

Alternatively, the bits may be inverted after the differential decoder. This may be done in hardware or software. A configuration similar to that in FIG. 10 may be used to invert the bitstream internally in the baseband unit.

Figure 11:
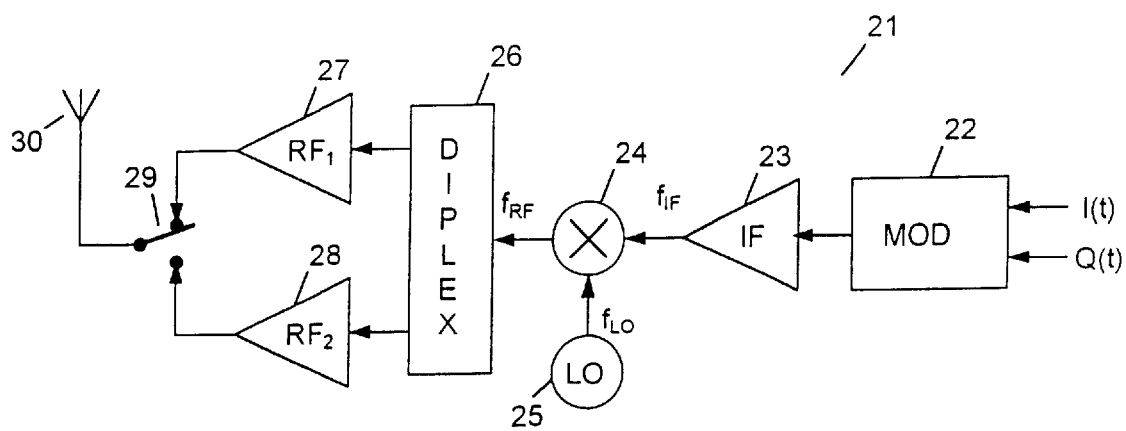
FIG. 11 shows a transmitter for radio signals according to the present invention.

Above, the situation has been described for a receiver. However, the problem and the solution are the same in the transmitter situation. An embodiment of a transmitter is shown in FIG. 11.

The I and Q signals from the coding circuitry are fed to the modulator 22, which was shown in FIG. 5. The modulated intermediate frequency signal is amplified in the amplifier 23 and then mixed with the signal from the local oscillator 25 in the mixer 24. The output from the mixer 24 contains signals in both radio frequency bands and in the diplexer they are divided between the two radio frequency amplifiers 27 and 28. Finally, a switch 29 selects which of the two signals is fed to the antenna 30. Also here, a sideband reversal occurs in the radio frequency signals when the transmitter shifts between the two bands. Again, it can be shown in the same way as above that this reversal effect may be compensated by a change of sign of the Q signal or by swapping the I and Q signals before they are fed to the modulator 22.

Although a preferred embodiment of the present invention has been described and shown, the present invention is not restricted to it, but may also be embodied in other ways. For instance the principle may also be used in units adapted for more than two frequency bands.

What is claimed is:

1. A radio receiver for receiving a radio signal in at least two frequency bands, the radio signal being modulated in accordance with a plurality of information signals and according to one of a phase modulation and a frequency modulation, the radio receiver comprising:
    a down-converting device for down-converting the received radio signal to an intermediate frequency signal, the down-converting device including a local oscillator having an oscillation frequency that is above a plurality of frequencies of one of the it least two frequency bands and below a plurality of frequencies of another one of the at least two frequency bands; and
    a demodulating device for recovering the plurality of information signals from the intermediate frequency signal, the demodulating device including a quadrature demodulator for recovering the plurality of information signals as an in-phase signal and a quadrature-phase signal; and
    a first device for
        assigning one of a positive sign and a negative sign to the quadrature-phase signal when a frequency of the received radio signal is below the frequency of the local oscillator, and
        assigning another one of the positive sign and the negative sign to the quadrature-phase signal when the frequency of the received radio signal is above the frequency of the local oscillator.

2. The radio receiver according to claim 1, wherein the oscillation frequency of the local oscillator is selected to be in a range substantially halfway between the at least two frequency bands.

3. The radio receiver according to claim 1, further comprising:
    a second device for maintaining the in-phase signal and the quadrature-phase signal unchanged when a frequency of the received radio signal is above the frequency of the local oscillator, and for exchanging the in-phase signal and the quadrature-phase signal when the frequency of the received radio signal is below the frequency of the local oscillator.

4. A radio transmitter for transmitting a radio signal in at least two frequency bands, the radio transmitter comprising:
    a modulating device for modulating an intermediate frequency signal in accordance with a plurality of information signals and in accordance with one of a phase modulation and a frequency modulation, the modulating device including a quadrature modulator for modulating the intermediate frequency signal as an in-phase signal and a quadrature-phase signal;
    an up-converting device for converting the intermediate frequency signal to the radio signal, the up-converting device including a local oscillator having an oscillation frequency selected such that a plurality of frequencies of one of the at least two frequency bands are above the oscillation frequency and a plurality of frequencies of another one of the at least two frequency bands are below the oscillation frequency;
    a first device for
        assigning one of a positive sign and a negative sign to the quadrature-phase signal when a frequency of the radio signal is below the frequency of the local oscillator, and for
        assigning another one of the positive sign and the negative sign to the quadrature-phase signal when the frequency of the radio signal is above the frequency of the local oscillator; and
    a transmitter device for transmitting the radio signal.

5. The radio transmitter according to claim 4, wherein the oscillator frequency is selected to be in a range substantially halfway between the at least two frequency bands.

6. The radio transmitter according to claim 4, further comprising
    a second device for maintaining the in-phase signal and the quadrature-phase signal unchanged when a frequency of the radio signal is above the frequency of the local oscillator, and for exchanging the in-phase signal and the quadrature-phase signal when the frequency of the radio signal is below the frequency of the local oscillator.

7. A radio receiver for receiving a radio signal in at least two frequency bands, the radio signal being modulated in accordance with a plurality of information signals and according to one of a phase modulation and a frequency modulation, the radio receiver comprising:
    a down-converting device for down-converting the radio signal to an intermediate frequency signal, the down-converting device including a local oscillator having an oscillation frequency that is above a plurality of frequencies of one of the at least two frequency bands and below a plurality of frequencies of another one of the at least two frequency bands;
    a demodulating device for recovering the plurality of information signals from the intermediate frequency signal, the demodulating device including a quadrature demodulator for recovering the plurality of information signals as an in-phase signal and a quadrature-phase signal; and
    a second device for maintaining the in-phase signal and the quadrature-phase signal unchanged when a frequency of the received radio signal is above the frequency of the local oscillator, and exchanging the in-phase signal and the quadrature-phase signal when the frequency of the received radio signal is below the frequency of the local oscillator.

8. The radio receiver as recited in claim 7, wherein the oscillation frequency of the local oscillator is selected to be in a range substantially halfway between the at least two frequency bands.

9. The radio-receiver as recited in claim 7, further comprising a first device for
assigning one of a positive sign and a negative sign to the quadrature-phase signal when a frequency of the received radio signal is below the frequency of the local oscillator, and
assigning another one of the positive sign and the negative sign to the quadrature-phase signal when the frequency of the received radio signal is above the frequency of the local oscillator.

10. A radio transmitter for transmitting a radio signal in at least two frequency bands, the radio transmitter comprising:

a modulating device for modulating an intermediate frequency signal in accordance with a plurality of information signals and in accordance with one of a phase modulation and a frequency modulation, the modulating device including a quadrature modulator for modulating the intermediate frequency signal as an in-phase signal and a quadrature-phase signal;

an up-converting device for converting the intermediate frequency signal to the radio signal, the up-converting device including a local oscillator having an oscillation frequency selected such that a plurality of frequencies of one of the at least two frequency bands are above the oscillation frequency and a plurality of frequencies of another one of the at least two frequency bands are below the oscillation frequency;

a second device for
maintaining the in-phase signal and the quadrature-phase signal unchanged when a frequency of the radio signal is above the frequency of the local oscillator, and for
exchanging the in-phase signal and the quadrature-phase signal when the frequency of the radio signal is below the frequency of the local oscillator; and a transmitter device for transmitting the radio signal.

11. The radio transmitter according to claim 10, wherein the oscillator frequency is selected to be in a range substantially halfway between the at least two frequency bands.

12. The radio transmitter according to claim 10, further comprising a first device for
assigning one of a positive sign and a negative sign to the quadrature-phase signal when a frequency of the radio signal is below the frequency of the local oscillator, and for
assigning another one of the positive sign and the negative sign to the quadrature-phase signal when the frequency of the radio signal is above the frequency of the local oscillator.

* * * * *